(12) United States Patent
Singer et al.

(10) Patent No.: US 8,646,990 B2
(45) Date of Patent: Feb. 11, 2014

(54) OPTOELECTRONIC MODULE AND OPTOELECTRONIC ARRANGEMENT

(75) Inventors: Frank Singer, Regenstauf (DE); Stefan Groetsch, Lengfeld-Bad Abbach (DE)

(73) Assignee: OSRAM Opto Semiconductors GmbH (DE)

( * ) Notice: Subject to any disclaimer, the term of this patent is extended or adjusted under 35 U.S.C. 154(b) by 434 days.

(21) Appl. No.: 12/922,492

(22) PCT Filed: Apr. 17, 2009

(86) PCT No.: PCT/DE2009/000541
§ 371 (c)(1),
(2), (4) Date: Oct. 21, 2010

(87) PCT Pub. No.: WO2009/143794
PCT Pub. Date: Dec. 3, 2009

(65) Prior Publication Data
US 2011/0116752 A1    May 19, 2011

(30) Foreign Application Priority Data

May 30, 2008  (DE) .......................... 10 2008 025 921
Aug. 21, 2008  (DE) .......................... 10 2008 039 147

(51) Int. Cl.
*G02B 6/36* (2006.01)
(52) U.S. Cl.
USPC ........................................................ 385/88
(58) Field of Classification Search
None
See application file for complete search history.

(56) References Cited

U.S. PATENT DOCUMENTS

| | | |
|---|---|---|
| 5,930,276 A | 7/1999 | Dou et al. |
| 2005/0025436 A1 | 2/2005 | Saito et al. |
| 2005/0062055 A1 | 3/2005 | Gallup et al. |
| 2005/0259927 A1* | 11/2005 | Kato ............................... 385/93 |
| 2006/0028825 A1 | 2/2006 | Epstein |
| 2006/0051029 A1* | 3/2006 | Aizpuru et al. .................. 385/88 |
| 2007/0019416 A1 | 1/2007 | Han et al. |
| 2007/0205425 A1 | 9/2007 | Harada |
| 2007/0235743 A1 | 10/2007 | Lee et al. |
| 2008/0272473 A1 | 11/2008 | Matsumoto et al. |

FOREIGN PATENT DOCUMENTS

| | | |
|---|---|---|
| DE | 100 53 569 A1 | 5/2001 |
| DE | 100 05 795 A1 | 8/2001 |
| DE | 10 2004 036 157 A1 | 2/2006 |
| DE | 10 2005 020 908 A1 | 8/2006 |
| DE | 10 2007 017 113 A1 | 8/2008 |
| EP | 1 788 673 A1 | 5/2007 |
| JP | 2-84351 | 6/1990 |
| JP | 2004-524679 | 8/2004 |
| JP | 2005-062842 | 3/2005 |
| JP | 2006-301544 | 11/2006 |
| WO | 02/056361 A1 | 7/2002 |

* cited by examiner

*Primary Examiner* — Tina Wong
(74) *Attorney, Agent, or Firm* — DLA Piper LLP (US)

(57) ABSTRACT

An optoelectronic module comprising: at least one light-emitting diode chip arranged on a carrier, and a mounting attachment fastened to the carrier and at least partly covering the light-emitting diode chip, and having a structured top which allows positioning of an optical element.

14 Claims, 4 Drawing Sheets

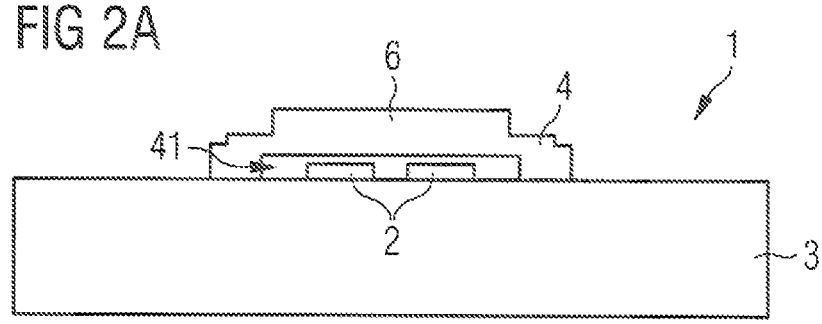
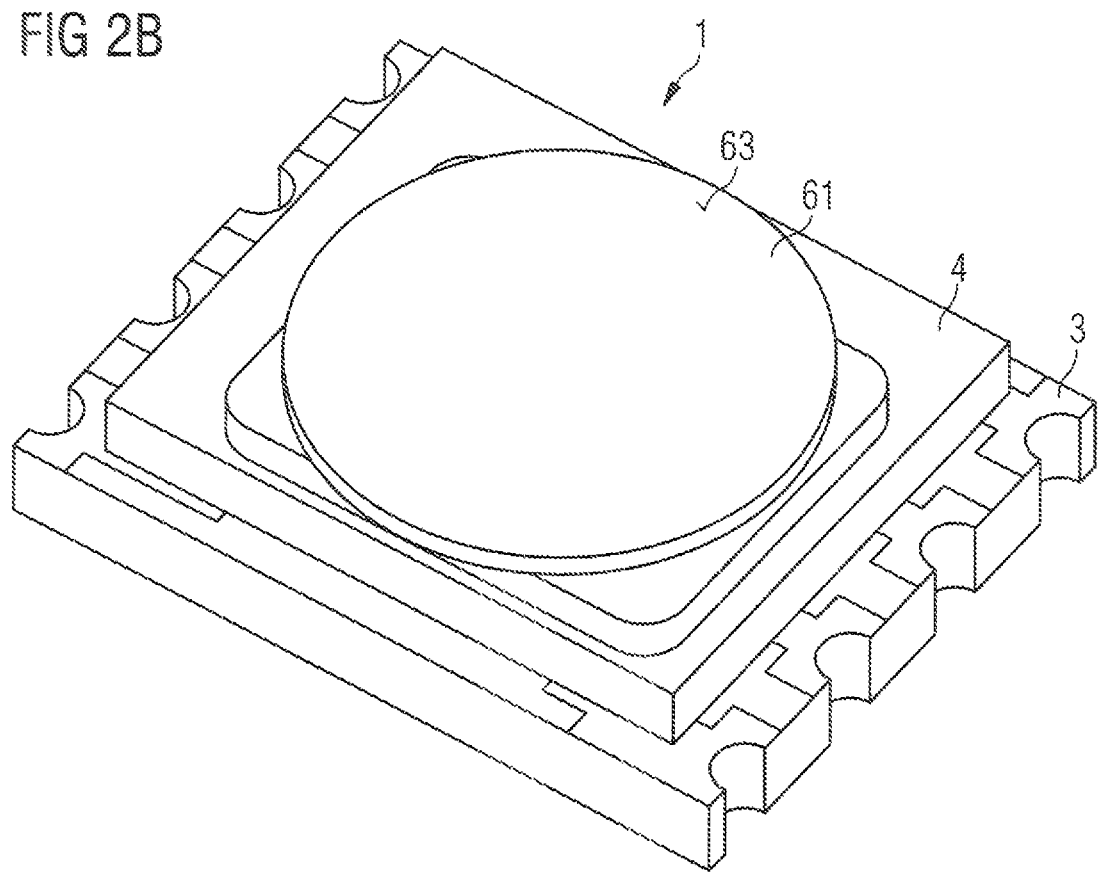

OPTOELECTRONIC MODULE AND OPTOELECTRONIC ARRANGEMENT

RELATED APPLICATIONS

This is a §371 of International Application No. PCT/DE2009/000541, with an international filing date of Apr. 17, 2009 (WO 2009/143794 A1, published Dec. 3, 2009), which is based on German Patent Application No. 10 2008 025 921.7 filed May 30, 2008 and German Patent Application No. 10 2008 039 147.6 filed Aug. 21, 2008, the subject matter of which is incorporated herein by reference.

TECHNICAL FIELD

This disclosure relates to optoelectronic modules and arrangements.

BACKGROUND

For projection devices such as, for example, car headlights a light source with a high level of luminance and a well defined radiation pattern is needed. By using an assembly of light-emitting diodes a high level of luminance may be produced. By means of optical elements the light may be collimated and focused into a desired spatial region. To achieve the desired radiation pattern it is necessary to position and mount the optical elements as precisely as possible relative to the light-emitting diodes.

DE 102004036157 A1 and DE 102005020908 A1 describe optoelectronic components with optical elements.

It could therefore be helpful to provide an optoelectronic module which allows a preferably simple positioning of optical elements.

SUMMARY

We provide an optoelectronic module comprising: at least one light-emitting diode chip arranged on a carrier, and a mounting attachment fastened to the carrier and at least partly covering the light-emitting diode chip, and having a structured top which allows positioning of an optical element. We also provide an optoelectronic arrangement comprising: optoelectronic module, and an optical element placed on the mounting attachment and comprising a structure fitted into selected locations of the top of the mounting attachment.

BRIEF DESCRIPTION OF THE DRAWINGS

The optoelectronic module and its advantageous configurations are explained below with reference to schematic figures, which are not to scale and in which:

FIG. 2A is a schematic sectional view of an optoelectronic module with mounting attachment, FIG. 2B is an oblique plan view of an optoelectronic module with mounting attachment.

DETAILED DESCRIPTION

Figure 1:
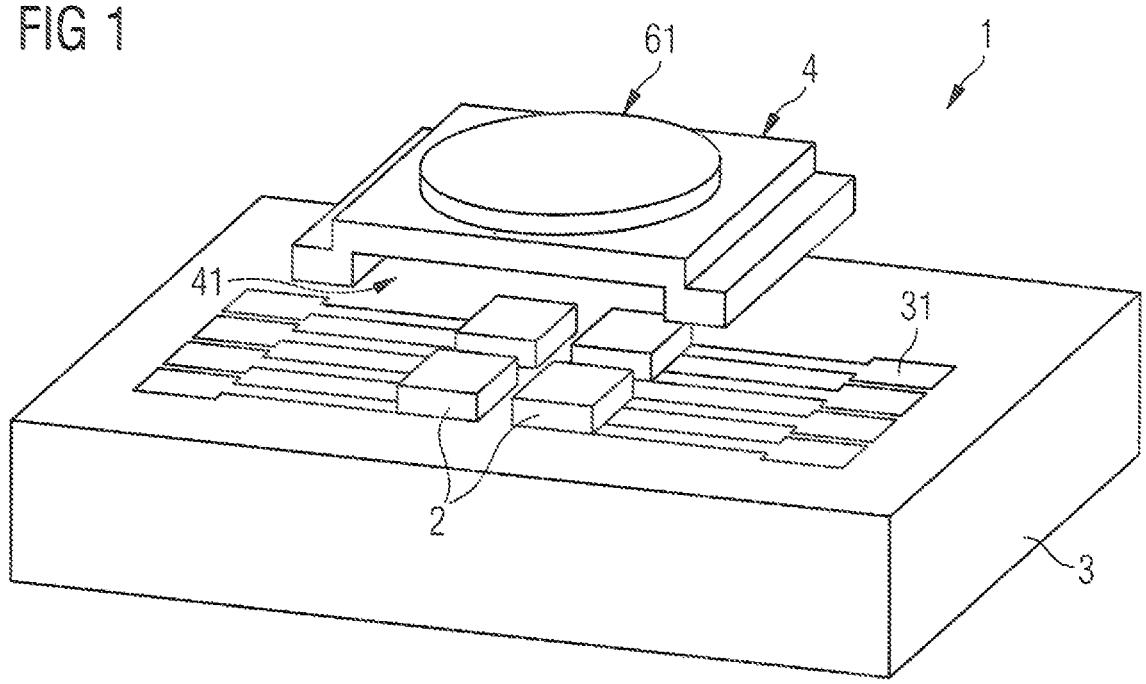
FIG. 1 is an oblique plan view of a mounting attachment, which is mounted on a carrier.

An optoelectronic module is provided which comprises at least one light-emitting diode chip arranged on a carrier.

A plurality of light-emitting diode chips may be arranged on the carrier. An optoelectronic module is therefore described below which comprises a plurality of light-emitting diode chips. However, we also cover an optoelectronic module comprising just one light-emitting diode chip.

For example, the light-emitting diode chips take the form of surface-mountable components arranged on a printed circuit board.

A mounting attachment is fastened to the carrier in a desired position relative to the light-emitting chips. Preferably the mounting attachment covers the light-emitting diode chips at least in part.

The mounting attachment may be transmissive for electromagnetic radiation in the spectral range of visible light at least in its transmission region. The transmission region is understood to mean the region of the mounting attachment through which the majority of the light generated in the light-emitting diode chips is emitted. The majority means, for example, at least 80%, preferably at least 90% of the emitted light. For example, the mounting attachment contains a radiation-transmissive material such as glass, a radiation-transmissive, in particular transparent, ceramic, aluminium nitride or aluminium oxide, or a radiation-transmissive, in particular transparent, plastic. The mounting attachment may also consist of such a radiation-transmissive material.

The mounting attachment may comprise an opening for emission of the light which is preferably arranged in the transmission region. In this case, the mounting attachment may also consist of a material which does not transmit radiation, for example, a metal.

Preferably, the mounting attachment contains a material with a high thermal conductivity. In this way, the light-emitting diode chips may be cooled well.

The mounting attachment comprises structuring of its top, which allows positioning of an optical element preferably in an emission region of the light-emitting diode chips.

To this end the bottom of the optical element comprises structuring complementary to the structuring of the mounting attachment at least in places. The optical element is placed onto the mounting attachment for mounting purposes in such a way that the structuring of the optical element is fitted into the complementary structuring of the mounting attachment. In this way, the optical element is positioned precisely relative to the mounting attachment. Since the mounting attachment is in turn positioned precisely relative to the light-emitting diode chips, the optical element is thus also positioned precisely relative to the light-emitting diode chips.

By means of the mounting attachment, precise and technically simple positioning of an optical element is thus possible. In particular, it is simple to equip the optoelectronic module subsequently with a desired optical element even after delivery to a customer.

In one variant, the structuring is such that the position of the optical element is fixed relative to the mounting attachment apart from for rotation about an axis of rotation. In this case the structuring exhibits rotational symmetry, for example.

In a further variant, the structuring of the mounting attachment definitively determines the position of the optical element and in particular its orientation relative to an axis of rotation.

In one example of the optoelectronic module, the optical element is fastened to the mounting attachment.

The optical element may, for example, be fastened to the mounting attachment by an adhesive. The adhesive is preferably transparent and has a refractive index conformed to the refractive indices of the optical element and the mounting attachment. This is particularly important when the mounting attachment is connected to the optical element in the transmission region.

In a further example, the optical element is fastened not to the mounting attachment, but rather, for example, to the carrier. In this case, the mounting attachment may be of optimum design in terms of its function as positioning aid, since it no longer has to be suitable for securing the optical element.

The top of the mounting attachment may be variously structured. For example, a raised portion is located on the top of the mounting attachment.

Preferably, a suitable optical element then comprises a recess of complementary configuration to the raised portion. To position the optical element, the optical element may be placed simply onto the mounting attachment in such a way that the raised portion is fitted into the recess.

The raised portions of the mounting attachment take the form of pegs, for example.

Preferably, the optical element contains slots arranged and configured to be complementary to the pegs of the mounting attachment. The optical element may be placed onto the mounting attachment such that a plug-in connection is produced between the pegs and slots. In this way, the optical element may be precisely positioned laterally relative to the light-emitting diode chips.

The raised portions comprise a circular or rectangular cross-section, for example. They may also be web-shaped or a have a cruciform cross-section.

In a further example of the mounting attachment, recesses are introduced into the top of the mounting attachment. The recesses are of slot-shaped configuration, for example. A suitable optical element comprises pin-shaped raised portions on its bottom. The structuring of the mounting attachment and of the optical element may also consist of a combination of recesses and raised portions.

In a further example, the recess passes through the mounting attachment and forms an opening. Preferably, the opening is located in the transmission region of the mounting attachment such that the light generated in the light-emitting diode chips may be emitted through the opening.

In a further example, the structuring of the mounting attachment comprises a plateau. The term plateau is used to denote a planar area which is raised or recessed relative to the area surrounding it and occupies a large part of the top of the mounting attachment. The plateau occupies, for example, a third of the area of the top of the mounting attachment. The plateau is preferably formed in the transmission region of the mounting attachment.

The optical element then preferably likewise comprises a plateau which is complementary to the plateau of the mounting attachment.

An optoelectronic arrangement is furthermore provided, which comprises an optoelectronic module with a mounting attachment and an optical element. The optical element is fitted into the structuring of the mounting attachment and thus positioned relative to the light-emitting diode chips.

Preferably, there is form-fitting contact between the optical element and the mounting attachment.

For example, form-fitting contact exists between a raised plateau of the mounting attachment and a recessed plateau of the optical element configured to be complementary to the raised plateau.

Alternatively, form-fitting contact may be produced between the optical element and the mounting attachment outside the plateau region. For example, the optical element is then fastened to the mounting attachment or to the carrier in the region outside the plateau region.

As a result of the form-fitting contact, reflection of the light at the interface between the mounting attachment and the optical element may be kept to a minimum. In one example, the mounting attachment is also firmly connected to the optical element in the region of the form-fitting contact. A transparent adhesive may be used for this purpose, for example.

In a further example, a space, for example, an air gap, is located between regions arranged above one another of the mounting attachment and of the optical element.

For example, such a gap may be provided in a transmission region of the mounting attachment. In this case, the optical element is preferably fastened to the mounting attachment in a region which lies outside the transmission region. This has the advantage that a material may also be used to connect the components which is not transparent for the emitted light.

Structuring of the mounting attachment is introduced for example by etching, sand-blasting or milling.

Preferably, the structuring is introduced before the mounting attachment is fastened to the carrier. This has the advantage that machining may be carried out without the risk of damage to the optoelectronic module. The mounting attachment is then fastened to the carrier in such a way that it is positioned suitably relative to the light-emitting diode chips.

A recess is preferably provided at the bottom of the mounting attachment, which recess serves to accommodate the light-emitting diode chips.

This recess may likewise be introduced by etching, sand-blasting or milling.

This example has the advantage that the mounting attachment may be mounted directly over the light-emitting diode chips without a further connecting element, for example, a spacer, being needed.

The above-described optoelectronic module may be inserted, for example, as the light source in a light of the floodlight type, for example, an automotive headlight or in a projection or display system.

Turning now to the drawings, FIG. 1 shows a carrier 3 on which a plurality of light-emitting diode chips 2 are arranged. The light-emitting chips 2 are electrically contactable by means of conductor tracks 31. The carrier 3 consists, for example, of a ceramic or of any other desired suitable material.

A transparent mounting attachment 4 is mounted on the carrier 3. On the bottom it comprises a recess 41 in which the light-emitting chips 2 may be accommodated. The mounting attachment 4 is open to the outside on two opposing side faces such that air may be exchanged with the surrounding environment. The mounting attachment 4 may, however, also be configured such that the light-emitting diode chips 2 are completely enclosed and no air can be exchanged. This has the advantage that the light-emitting diode chips 2 are better protected against external influences. The mounting attachment 4 is, for example, adhesively bonded to the carrier 3.

FIG. 2A is a schematic sectional view of an optoelectronic module 1 with a mounting attachment 4 placed thereon. In this example the mounting attachment 4 completely covers the light-emitting diode chips 2. In this way, the light-emitting diode chips 2 are protected from mechanical damage.

FIG. 2B is a schematic plan view of an optoelectronic module 1 with a mounting attachment 4 fastened to a carrier 3. The optoelectronic module 4 comprises a circular raised portion 61 with a plateau 63, onto which an optical element with a corresponding recess may be plugged. In this example, the light-emitting diode chips 2 are completely surrounded by the mounting attachment 4 and by the carrier 3 and are thus protected from external influences.

Figure 3A:
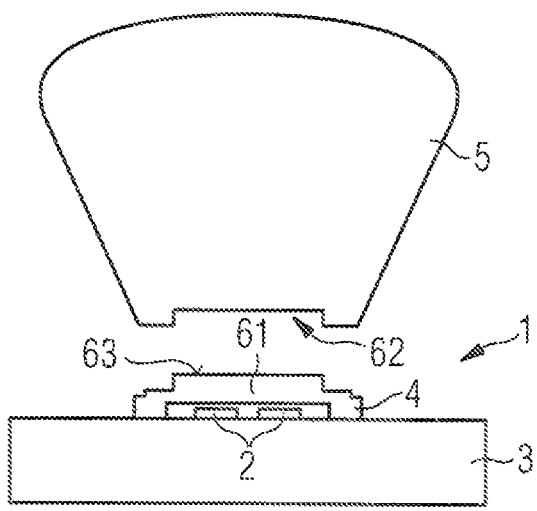
FIG. 3A is a schematic sectional view of an optoelectronic module with mounting attachment on which an optical element is being placed.

FIG. 3A shows an optoelectronic module 1 with a mounting attachment 4 on which an optical element 5 is being mounted. The mounting attachment 4 comprises a plateau-shaped raised portion 61. A corresponding recess 62 complementary thereto is formed in the bottom of the optical element 5. If the optical element 5 is to be connected firmly to the mounting attachment 4, a transparent adhesive is, for example, applied to the plateau-shaped regions 62, 63 of the optical element 5 and the mounting attachment 4. A transparent adhesive is preferably used because the plateau-shaped region 63 is arranged in the transmission region of the mounting attachment.

Figure 3B:
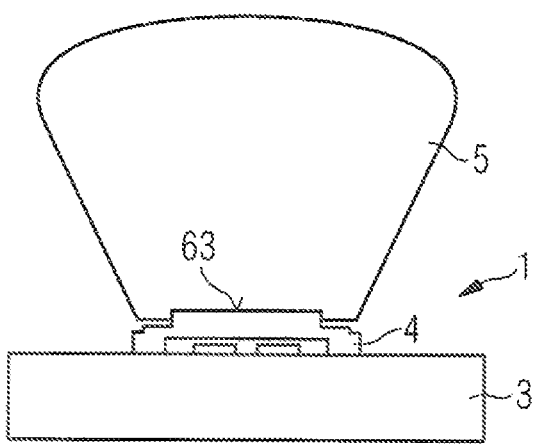
FIG. 3B is a schematic sectional view of an optoelectronic module with mounting attachment and an optical element placed thereon.

FIG. 3B shows an optoelectronic module 1 to which an optical element 5 is fastened. The optical element 5 is placed on the mounting attachment 4 in such a way that the raised portion 61 is fitted into the complementary recess 62. In the region of the plateau 63 there is form-fitting contact between the mounting attachment 4 and the optical element 5. In this example, the optical element 5 is connected firmly with the mounting attachment 4 in the plateau region 63, for example, by a transparent adhesive.

Figure 4:
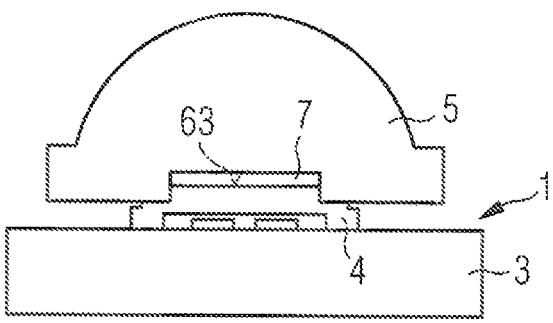
FIG. 4 is a schematic sectional view of a further example of an optoelectronic module with a mounting attachment and an optical element placed thereon.

FIG. 4 shows an optoelectronic module 1 with a mounting attachment 4 and an optical element 5 fastened thereto. The optoelectronic module 1 is constructed in accordance with the optoelectronic module 1 in FIG. 3B, but provided with a different optical element 5. The bottom of this optical element 5 is structured such that a space 7 is located between the optical element 5 and the mounting attachment 4 in the region of the plateau 63. In this case there is form-fitting contact between the optical element 5 and the mounting attachment 4 in a region of the mounting attachment 4 which lies beyond the plateau 63. For example, the optical element 5 is firmly connected to the mounting attachment 4 in the region of the form-fitting contact by an adhesive.

FIGS. 5A to 5D show various options for structuring the mounting attachment 4. The crosshatched regions are in each case recessed relative to the regions which are not cross-hatched.

Figure 5A:
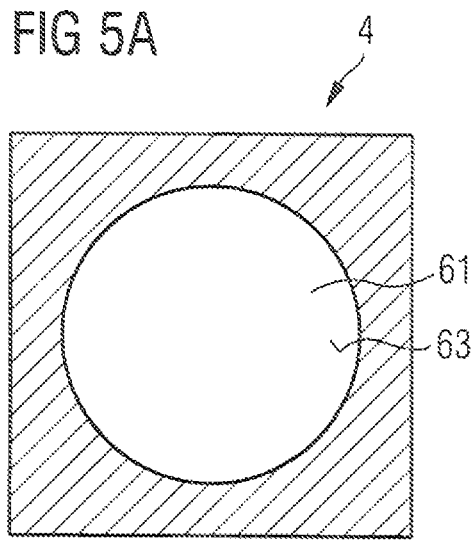
FIGS. 5A to 5D are schematic plan views of mounting attachments with different structuring.

The mounting attachment 4 shown in FIG. 5A comprises a circular raised portion 61 with a plateau 63. An optical element preferably comprises a complementary recess, and is placed on the mounting attachment 4, for example as shown in FIGS. 3B and 4. The raised portion 61 is rotationally symmetrical relative to an axis of rotation perpendicular to the plateau 63. This rotational symmetry determines the positioning of an optical element 4 apart from the possibility of rotation about this axis of rotation. Rotationally symmetrical structuring is sensible in particular when the optical element 4 is likewise of rotationally symmetrical construction. In this case, rotation of the optical element 4 about the axis of rotation does not have any influence on the orientation of the optical element 4 relative to the light-emitting diode chips 2.

Figure 5B:
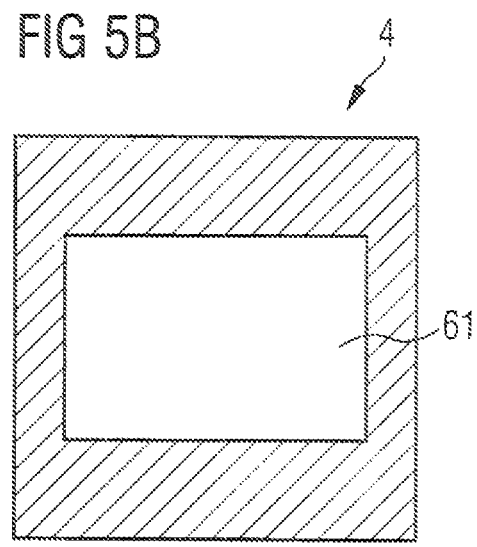

FIG. 5B shows a mounting attachment 4 with a raised portion 61 with a rectangular cross-section. A suitable optical element comprises a complementary recess. Since the rectangular raised portion 61 may be transposed onto itself by rotation by 180° relative to an axis of rotation perpendicular to the plateau 63, positioning of an optical element is determined apart from the possibility of rotation by 180° about this axis of rotation.

Figure 5C:
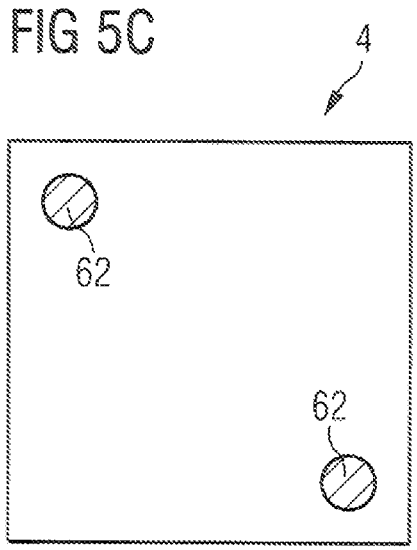

In the case of the mounting attachment 4 shown in FIG. 5C, recesses 62 in the form of circular slots are provided. The optical element preferably comprises complementarily arranged pegs, which may be inserted into the slots 62. Here too, the structuring in the form of the pin-shaped recesses 62 may be transposed onto itself by rotation by 180° relative to an axis of rotation. A suitable optical element 5 may therefore here too be placed in two different ways onto the mounting attachment 4.

Figure 5D:
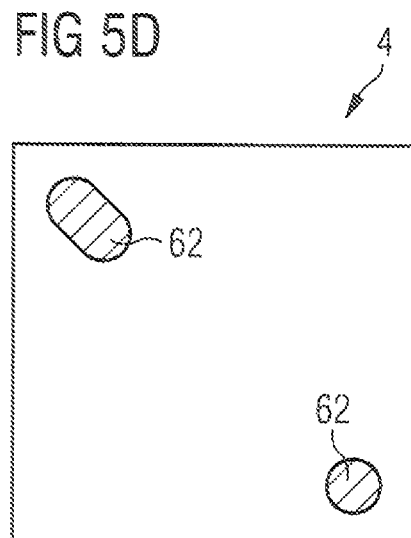

In the case of the mounting attachment 4 illustrated in FIG. 5D, one circular and one elongate slot 62 are provided. This structuring cannot be transposed onto itself by rotation by an angle greater than 0° and smaller than 360°. The position of an optical element 5 is therefore definitively determined in this case.

In alternative examples the crosshatched regions shown in FIGS. 5A to 5D are raised portions and the regions which are not cross-hatched are recesses.

The description made with reference to examples does not restrict the disclosure to those examples, but rather encompasses any novel feature and any combination of features. These include in particular any combination of features in the appended claims, even if the feature or combination is not itself explicitly indicated in the claims or examples.

The invention claimed is:

1. An optoelectronic arrangement comprising:
   an electronic module comprising:
      at least one light-emitting diode chip arranged on a carrier,
      a mounting attachment fastened to the carrier and at least partly covering the light-emitting diode chip, and having a structured top which allows positioning of an optical element, and
      an optical element fastened to the carrier,
   wherein
      the top comprises a raised plateau,
      the raised plateau is arranged in a transmission region of the mounting attachment, and
      the optical element is fastened to the carrier and comprises a structure fitted to the raised plateau on top of the mounting attachment.

2. The optoelectronic arrangement according to claim 1, further comprising a recess at a bottom of the mounting attachment which accommodates the light-emitting diode chip.

3. The optoelectronic arrangement according to claim 1, wherein the mounting attachment completely covers the light-emitting diode chip.

4. The optoelectronic arrangement according to claim 1, wherein the mounting attachment completely covers the light-emitting diode chip and completely surrounds laterally the chip.

5. The optoelectronic arrangement according to claim 1, wherein the top of the mounting attachment has at least one pin-shaped raised portion.

6. The optoelectronic arrangement according to claim 1, wherein the top of the mounting attachment has a slot-shaped recess.

7. The optoelectronic arrangement according to claim 1, wherein an opening is located in the top of the mounting attachment.

8. The optoelectronic arrangement according to claim 1, wherein a space between the mounting attachment and the at least one light-emitting diode chip is filled with a gas.

9. The optoelectronic arrangement according to claim 1, further comprising a two-dimensional contact between the mounting attachment and the optical element in the transmission region of the mounting attachment.

10. The optoelectronic arrangement according to claim 1, further comprising a space located between the mounting attachment and the optical element in the transmission region.

11. The optoelectronic arrangement according to claim 1, wherein the optical element is fastened to the mounting attachment.

12. The optoelectronic arrangement according to claim 1, wherein the optical element is fastened to the carrier.

13. The optoelectronic arrangement according to claim 1, wherein the optical element comprises a recess plateau that is complementary to the raised plateau.

14. An optoelectronic arrangement comprising:
an optoelectronic module comprising:
at least one light-emitting diode chip arranged on a carrier, and
a mounting attachment fastened to the carrier and at least partly covering the light-emitting diode chip, and having a structured top which allows positioning of an optical element,
an optical element placed on the mounting attachment, wherein
the top comprises a raised plateau,
the raised plateau is arranged in a transmission region of the mounting attachment,
the optical element comprises a recess that is complementary to the raised plateau, and
the optical element is placed on the mounting attachment such that the raised plateau is fitted into the complementary recess to precisely position the optical element with respect to the at least one light-emitting diode chip.

* * * * *